US008067767B2

(12) United States Patent  
Yun et al.

(10) Patent No.: US 8,067,767 B2
(45) Date of Patent: Nov. 29, 2011

(54) DISPLAY SUBSTRATE HAVING VERTICAL THIN FILM TRANSISTOR HAVING A CHANNEL INCLUDING AN OXIDE SEMICONDUCTOR PATTERN

(75) Inventors: Pil-Sang Yun, Seoul (KR); Do-Hyun Kim, Seoul (KR); Byeong-Beom Kim, Suwon-si (KR); Bong-Kyun Kim, Incheon-si (KR)

(73) Assignee: Samsung Electronics Co., Ltd. (KR)

( * ) Notice: Subject to any disclaimer, the term of this patent is extended or adjusted under 35 U.S.C. 154(b) by 248 days.

(21) Appl. No.: 12/393,521

(22) Filed: Feb. 26, 2009

(65) Prior Publication Data

US 2010/0155715 A1    Jun. 24, 2010

(30) Foreign Application Priority Data

Dec. 22, 2008   (KR) .......................... 10-2008-0131006

(51) Int. Cl.
*H01L 29/786* (2006.01)

(52) U.S. Cl. ............ 257/43; 257/72; 257/328; 257/330; 257/E29.274

(58) Field of Classification Search ............ 257/E29.274
See application file for complete search history.

(56) References Cited

U.S. PATENT DOCUMENTS

| 6,800,874 | B2 | 10/2004 | Hsieh |
| 6,995,053 | B2 | 2/2006 | Schuele et al. |
| 7,235,437 | B2 | 6/2007 | Schuele et al. |
| 7,250,627 | B2* | 7/2007 | Hoffman ................ 257/59 |
| 2003/0218222 | A1* | 11/2003 | Wager et al. ............ 257/410 |
| 2005/0206798 | A1* | 9/2005 | Kim ........................ 349/54 |
| 2007/0023750 | A1* | 2/2007 | Chiang et al. ............. 257/43 |
| 2008/0014686 | A1* | 1/2008 | Wang et al. ............. 438/156 |
| 2009/0289249 | A1* | 11/2009 | Kato et al. ................ 257/43 |

FOREIGN PATENT DOCUMENTS

| JP | 2006-269323 | 10/2006 |
| KR | 10-2000-0021376 | 4/2000 |
| KR | 10-2000-0038333 | 7/2000 |
| KR | 10-2003-0050669 | 6/2003 |

* cited by examiner

*Primary Examiner* — Stephen W Smoot

(74) *Attorney, Agent, or Firm* — Cantor Colburn LLP

(57) ABSTRACT

A display substrate according to the present invention comprises a gate line formed on a substrate, a data line, a thin film transistor connected to the gate line and the data line respectively and pixel electrode connected to the thin film transistor, wherein a channel of the thin film transistor is formed in a direction perpendicular to the substrate and, a layer where the channel is formed includes an oxide semiconductor pattern. ON current of thin film transistor of the display substrate can be increased without loss of aperture ratio.

5 Claims, 12 Drawing Sheets (a)

(b)

(c)

(d)

(a)

(b)

(c)

(d)

DISPLAY SUBSTRATE HAVING VERTICAL THIN FILM TRANSISTOR HAVING A CHANNEL INCLUDING AN OXIDE SEMICONDUCTOR PATTERN

CROSS-REFERENCE TO RELATED APPLICATIONS

This application claims priority to Korean Patent Application No. 10-2008-0131006 filed on Dec. 22, 2008, the contents of which are herein incorporated by reference in their entireties.

BACKGROUND OF THE INVENTION

1. Technical Field

The present invention relates to a display substrate and a method of manufacturing the same, and more particularly, a display substrate for displaying an image and a method of manufacturing the same.

2. Discussion of the Related Art

A liquid crystal display device which is a display device for displaying images includes a display substrate, a counter substrate disposed opposite the display substrate, and a liquid crystal layer disposed between the two substrates.

Generally, a display substrate includes gate wirings, data wirings, thin film transistors (TFTs) and pixel electrodes that are formed on the transparent substrate to drive a plurality of pixels independently. The counter substrate includes red, green and blue color filters, a black matrix and a common electrode opposite the pixel electrode.

As is well known, ON current (Ion) of the TFT is improved as W/L, a ratio of channel width and channel length of TFT, is increased and as effective mobility is increased. However, in conventional TFT structures in which the channel is formed in a direction parallel to the surface of the substrate, there is a limitation in reducing the channel length (L) due to an exposure limitation. Thus, a vertical TFT in which the channel is formed in a direction perpendicular to the substrate has been introduced recently. In this case, the channel length (L) can be reduced more than the conventional structures because the channel length (L) can be controlled by controlling the thickness of the channel layer, and therefore, ON current (Ion) can also be improved to some extent. However, even in such a case, there is a need for increasing ON current by increasing the effective mobility.

SUMMARY OF THE INVENTION

Embodiments of the present invention provide a display substrate having TFT improved in terms of ON current due to the reduction of channel length and the increase of effective mobility.

An embodiment of the present invention provides a method of manufacturing the display substrate.

The present invention discloses a display substrate comprising a gate line formed on a substrate, a data line, a thin film transistor connected to the gate line and the data line respectively and pixel electrode connected to the thin film transistor, wherein a channel of the thin film transistor is formed in a direction perpendicular to the substrate and, a layer where the channel is formed includes an oxide semiconductor pattern.

Preferably, The display substrate according to the present invention may comprise: a substrate; a source electrode, an oxide semiconductor pattern and a drain electrode sequentially formed in a direction perpendicular to the substrate; a gate electrode formed adjacent to the source electrode, the oxide semiconductor pattern and the drain electrode with an insulating layer being therebetween; and a pixel electrode connected to the drain electrode.

More preferably, the display substrate according to the present invention may comprises: a substrate; a data signal line extending in a first direction on the substrate; a gate signal line extending in a second direction crossing the first direction and insulated with the data signal line; a thin film transistor connected to the data signal line and the gate signal line respectively; and a pixel electrode connected to the thin film transistor, wherein the thin film transistor comprises: a source electrode connected to the data signal line; an oxide semi conductor pattern formed on the source electrode; a drain electrode formed on the oxide semiconductor pattern; and a gate electrode connected to the gate signal line and formed adjacent to the source electrode, the oxide semiconductor pattern and the drain electrode with an insulating layer being therebetween.

The oxide semiconductor pattern may comprise at least one of Ga, Zn, In and Sn, and O.

A recess portion is preferably formed on the data signal line and the gate electrode may be formed on the recess portion with the insulating layer being therebetween. Due to such a structure, it becomes possible to guarantee the position for the gate electrode which makes controlling channel current possible when gate voltage is applied.

The present invention also discloses a method for manufacturing a display substrate comprising: forming a data signal line and a source electrode connected to the data signal line on a substrate, forming a first insulating layer and forming a first trench exposing the source electrode on the first insulating layer; forming an oxide semiconductor pattern and a drain electrode on the source electrode exposed by the first trench; forming a second trench extended in a direction crossing the data signal line on the first insulating layer; forming a second insulating layer on the substrate; forming a gate signal line and a gate electrode on the second insulating layer of the region where the second trench is formed; forming a third insulating layer on the substrate; forming a contact hole exposing the drain electrode in the second and the third insulating layer; and forming a pixel electrode connected to the drain electrode through the contact hole on the third insulating layer.

In one embodiment of the invention, forming the first trench comprises: forming a photosensitive layer on the first insulating layer; forming a photosensitive layer pattern by exposing and developing the photosensitive layer; and exposing the source electrode by dry etching the first insulating layer by using the photosensitive layer pattern as a mask.

In case the first trench is formed according to the above process, the forming the oxide semiconductor pattern and the drain electrode can in some embodiments of the invention comprise: forming an oxide semiconductor layer and a drain metal layer on the substrate on which the photosensitive layer remains; and removing the oxide semiconductor layer and the drain metal layer formed on the photosensitive layer. By selectively removing the oxide semi conductor layer and the drain metal layer formed on the photosensitive layer, the oxide semiconductor layer and the drain metal layer remaining in the first trench form an oxide semiconductor pattern and a drain electrode naturally.

In the above case, the oxide semiconductor layer and the drain metal layer formed on the photosensitive layer are preferably removed together with the photosensitive layer. By the above, the manufacturing process can be simplified.

In the meantime, the second trench is preferably formed adjacent to the source electrode, the semiconductor pattern and the drain electrode. By the above, a loss of aperture ratio of the display substrate can be minimized.

The second trench may be formed by dry etching the first insulating layer, and a part of the data signal line crossing the second trench is preferably etched together when the first insulating layer is dry etched.

In the above case, the gate electrode is preferably formed on the etched region of the data signal line with the second insulating layer being therebetween. Due to that, it becomes possible to guarantee the position of the gate electrode which makes controlling channel current possible when gate voltage is applied.

BRIEF DESCRIPTION OF THE DRAWINGS

The above and other features of the present disclosure will become more apparent by describing exemplary embodiments thereof with reference to the accompanying drawings, in which.

DETAILED DESCRIPTION OF THE EXEMPLARY EMBODIMENTS

Figure 1:
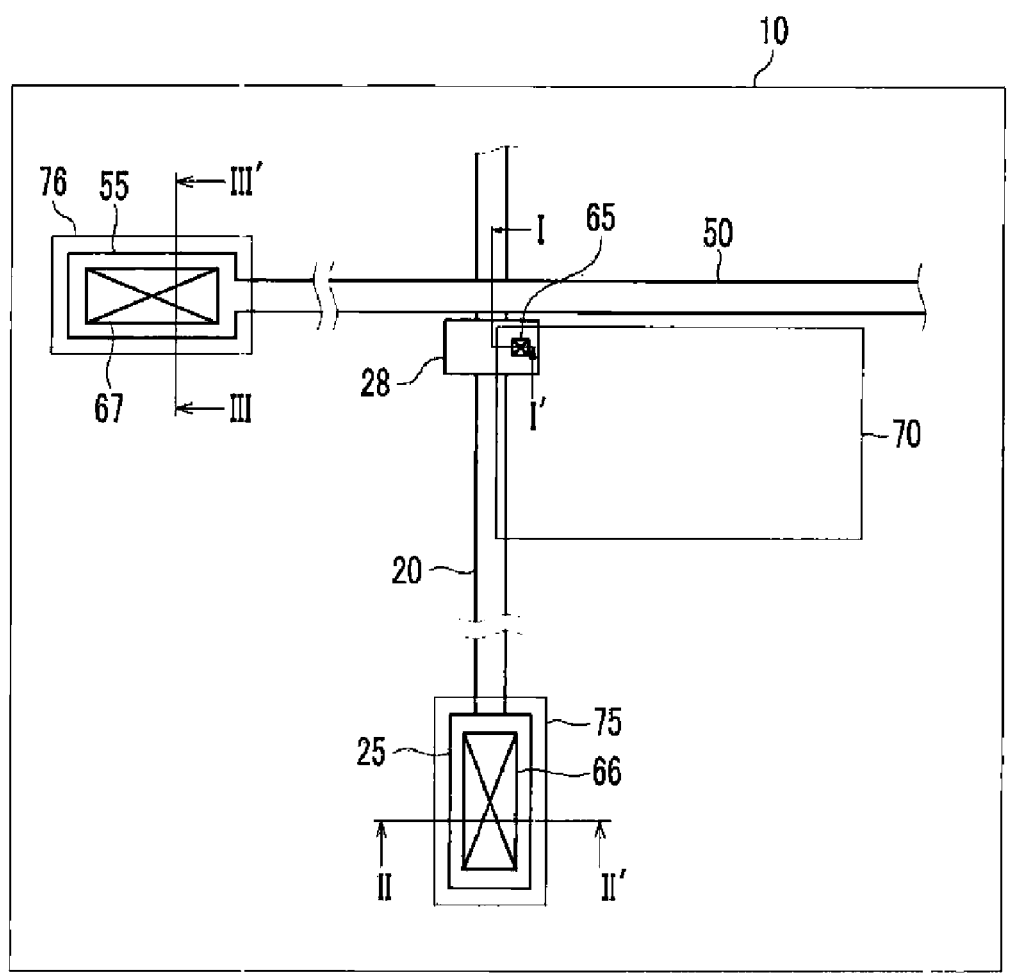
FIG. 1 is a plan view roughly describing a display substrate according to the present invention.

The invention is described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

Figure 2:
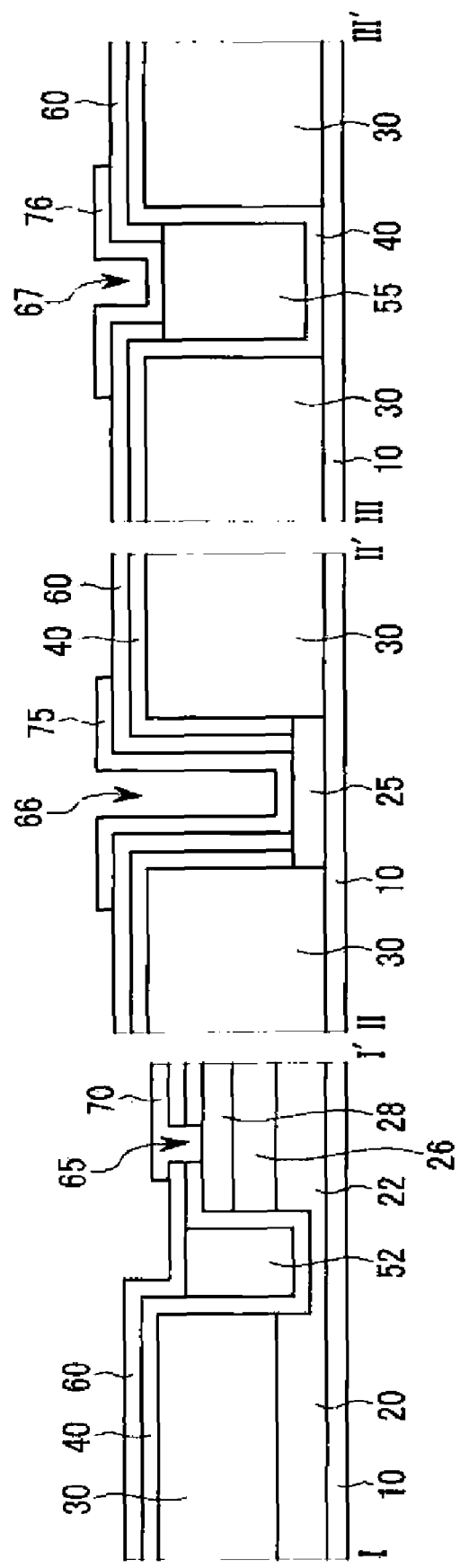
FIG. 2 is cross sectional views taken along lines I-I', II-II' and III-III' of FIG. 1

FIG. 1 is a plan view roughly describing a display substrate according to the present invention, and FIG. 2 illustrates cross sectional views taken along lines I-I' II-II' and III-III' of FIG. 1.

Referring to FIGS. 1 and 2, a data wiring is disposed on one side of a substrate (10) which is made of, for example, a transparent glass, quartz or plastic. The data wiring comprises a data signal line (20) extended in a first direction, a source electrode(22) connected to the data signal line(20) and a data pad electrode(25).

A first insulating layer(30) is disposed on the data wiring. The first insulating layer(30) is formed to expose the source electrode(22) and the data pad electrode(25).

An oxide semiconductor pattern(26) and a drain electrode (28) are sequentially disposed on the source electrode(22) exposed by the first insulating layer(30).

In the structure that the source electrode(22), the semiconductor pattern(26) and the drain electrode(28) are sequentially disposed as described above, a channel of a thin film transistor located between source electrode (22) and drain electrode (28) is formed in a direction perpendicular to the substrate(10). In this case, the exposing limitation can be overcome, and therefore the channel length can be reduced, because the thickness of the semiconductor layer can be controlled accurately.

The oxide semiconductor pattern(26) comprises O and at least one of Zn, In, Ga and Sn. For example, InZnO, InGaO, InSnO, ZnSnO, GaSnO, GaZnO or GaInZnO may be used as the oxide semiconductor pattern(26). The oxide semiconductor pattern(26) has superior semiconductor characteristic such that it has effective mobility 2 to 100 times larger than hydrogenated amorphous silicon, and has an ON/OFF ratio of 10^5 to 10^8. Group 3, 4 or 5 elements or transition elements on the periodic table may be used to improve the characteristic of the oxide semiconductor.

Due to the above described structure, the channel length of the thin film transistor can be accurately reduced and the effective mobility can be increased, which results in an increase of ON current of the thin film transistor.

Meanwhile, a gate signal line(50) insulated from the data wiring(20,22,25), the oxide semiconductor pattern(26) and the drain electrode (28) is disposed in a second direction crossing the data signal line(20). And, a gate electrode(52) connected to the gate signal line(50) is formed at a region adjacent to the lamination of the source electrode(22), the oxide semiconductor pattern(26) and the drain electrode(28).

In the embodiment described in FIG. 1, the gate signal line(50) itself crosses the data signal line(20) at the region adjacent to the lamination of the source electrode(22), the oxide semiconductor pattern(26) and the drain electrode(28). In this case, a portion of the gate signal line(50) adjacent to the lamination(22,26,28) forms the gate electrode(52). Namely, the gate electrode(52) is formed at a portion of the gate signal line(50) crossing the data signal line(20). Due to the above structure, the loss of aperture ratio of the display substrate can be minimized.

Moreover, a recess having a certain depth may be formed at a region of the data signal line(20) crossing the gate electrode (52). Namely, the gate electrode(52) may be formed on the recess of the data signal line(20). By forming the recess on the data signal line(20), it becomes possible to control the position for the gate electrode which makes controlling a channel current possible when a gate voltage is applied.

A gate pad electrode(55) is formed at an end portion of the gate signal line(50).

A third insulating layer(50) is formed on the second insulating layer(40), and a pixel electrode(70) connected to the drain electrode(28) through a first contact hole(65) formed at the second and third insulating layers(40,60), is formed on the third insulating layer(60). Also, a first auxiliary layer(75) connected to the data pad electrode(25) through a second contact hole(66) is formed at a data pad portion, and a second auxiliary layer(76) connected to the gate pad electrode(55) through a third contact hole(67) is formed at a gate pad portion.

Hereinafter, a method for manufacturing the display substrate according to the present invention will be explained. FIG. 3 to FIG. 12 are plan views and cross sectional views describing the manufacturing process of the display substrate of FIG. 1.

Figure 3:
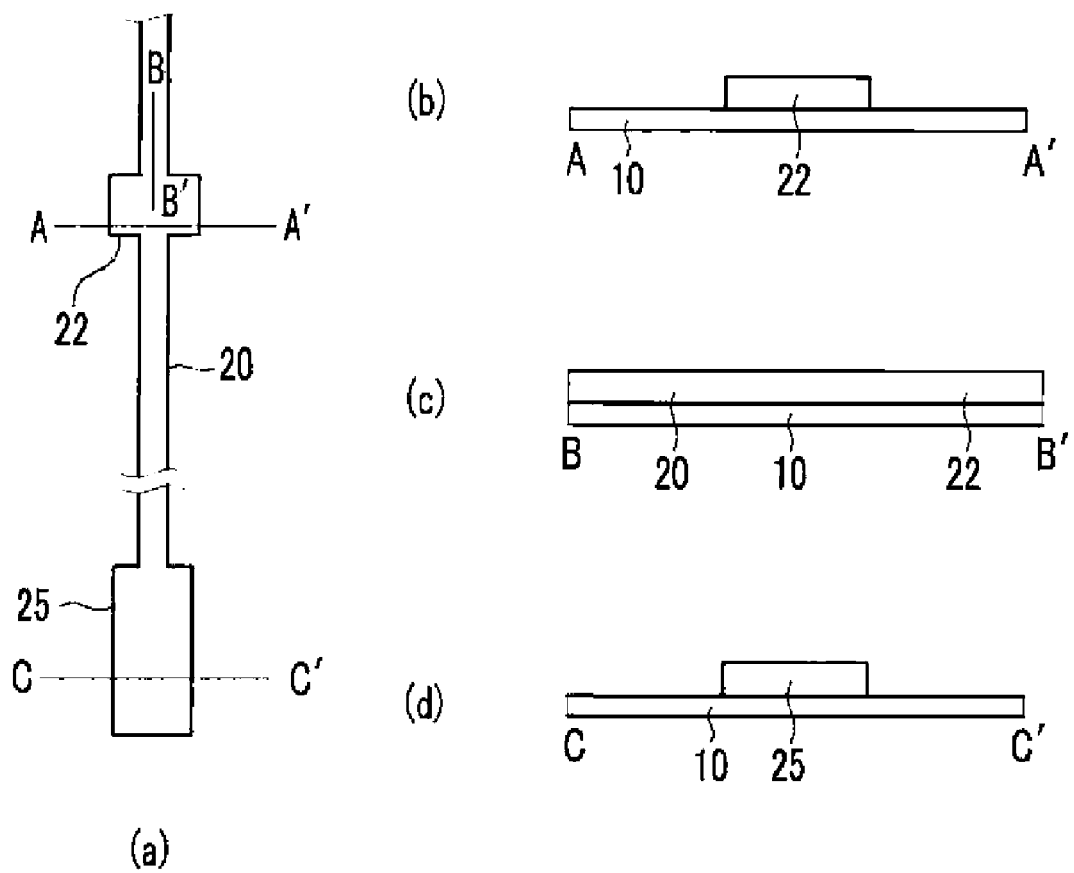
FIG. 3 to FIG. 12 are plan views and cross sectional views describing the manufacturing process of the display substrate of FIG. 1

Referring to FIG. 3, a metal layer for a data wiring is formed on one side of an insulating substrate(10) which is made of, for example, transparent glass, quartz or plastic, and then a data wiring is formed by patterning the metal layer. The data wiring comprises a data signal line(20) extended in a first direction, a source electrode(22) connected to the data signal line(20) and a data pad electrode(25) connected to an end portion of the data signal line(20). The data wiring(20,22,25) is made of, for example, a single layer of Mo, or a double layer of Al/Mo, Al/Ti or CuOx/Cu which can form an ohmic contact with an oxide semiconductor layer that will be described later.

Figure 4:
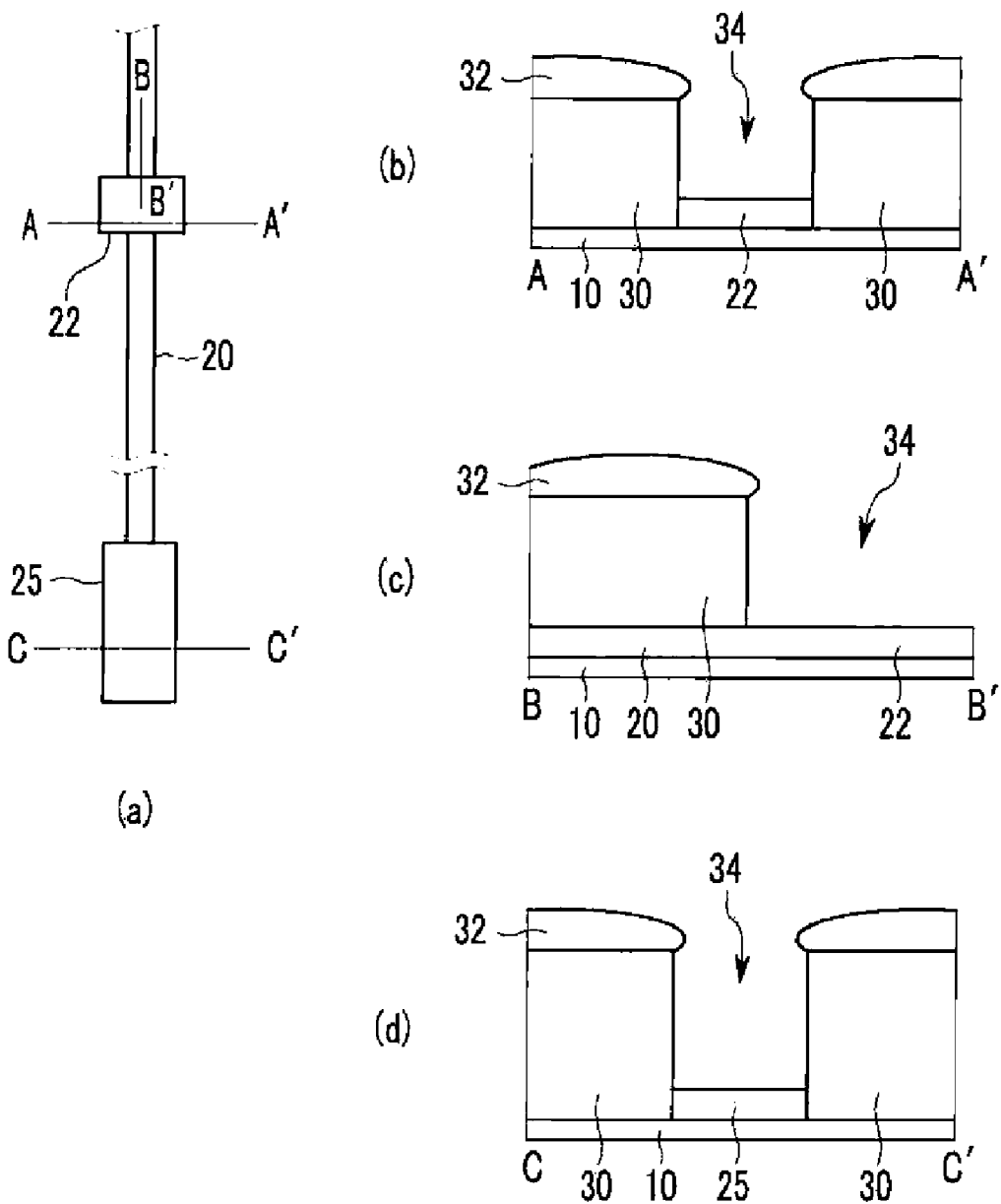

Referring to FIG. 4, a first insulating layer(30) which is made of, for example, SiNx or SiOx is formed on the substrate (10), and then a first trench(34) exposing the source electrode (22) and the data pad electrode(25) is formed by dry etching the first insulating layer(30).

The first trench(34) is formed by the following process. A photosensitive layer(32) is formed on the first insulating layer (30), and then a region of the first insulating layer under which the source electrode(22) and the data pad(25) is formed is exposed by patterning the photosensitive layer(32) through exposing and developing processes. Then, a first trench(34) is formed by dry etching the exposed region of the first insulating layer. Meanwhile, as described in FIG. 4, the photosensitive layer formed at a boundary region of the first trench(34) is extruded into the first trench(34).

Figure 5:
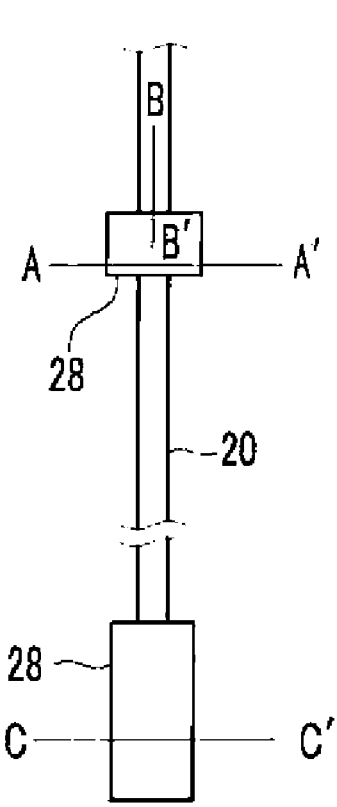
Figure 5:
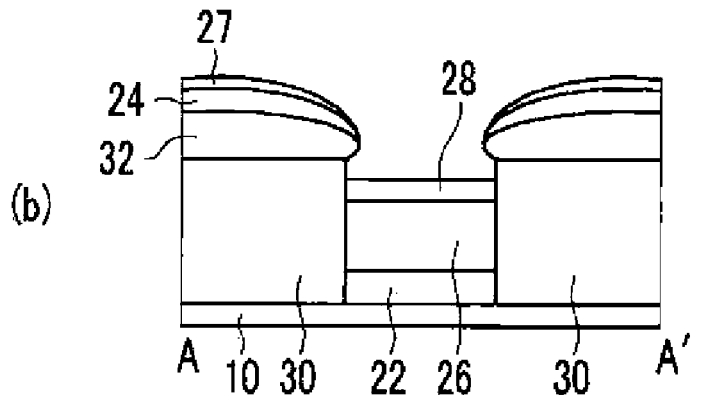
Figure 5:
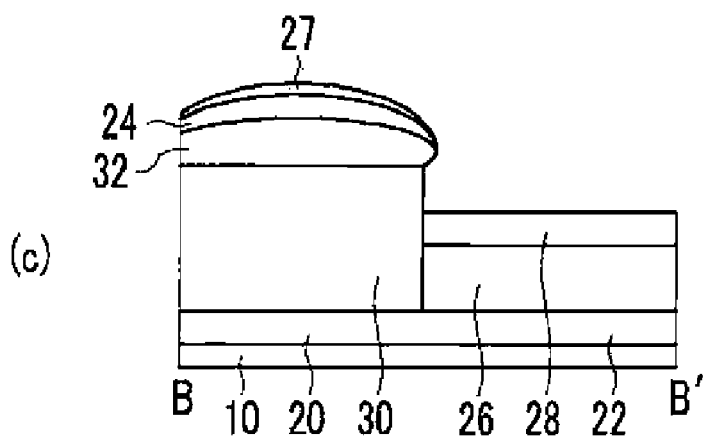
Figure 5:
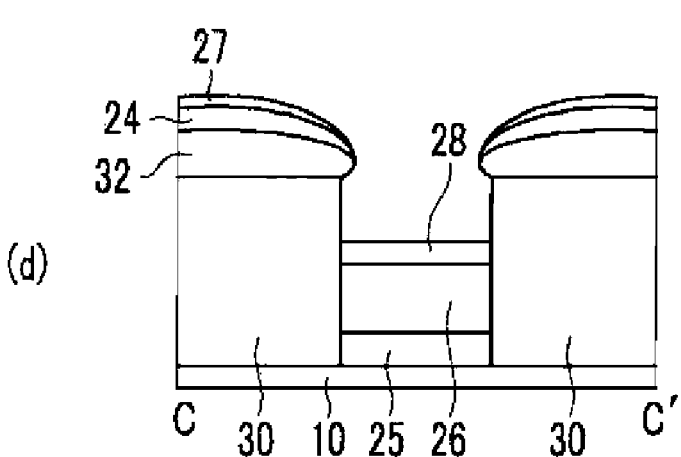
Figure 6:
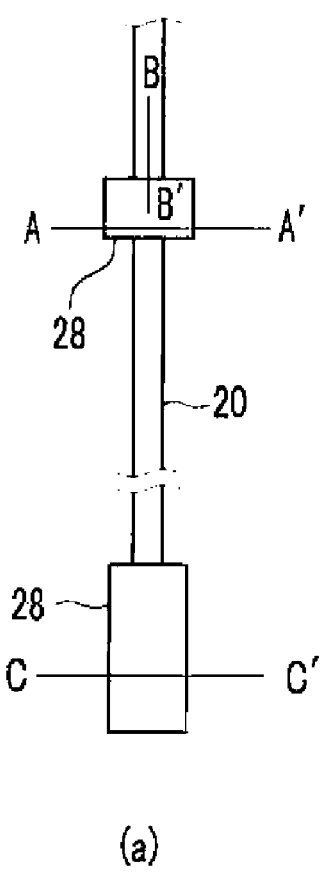
Figure 6:
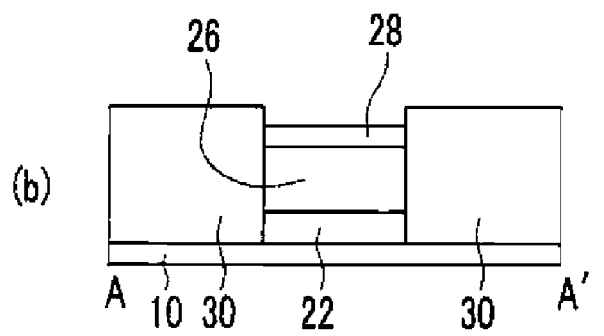
Figure 6:
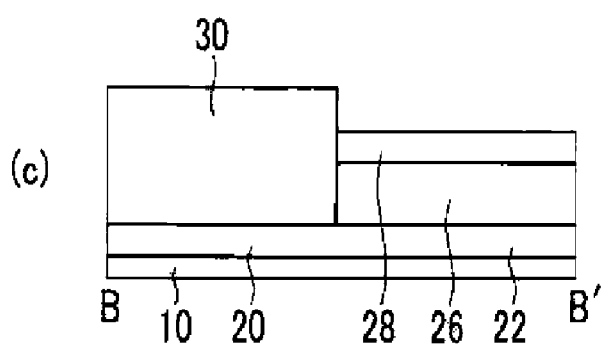
Figure 6:
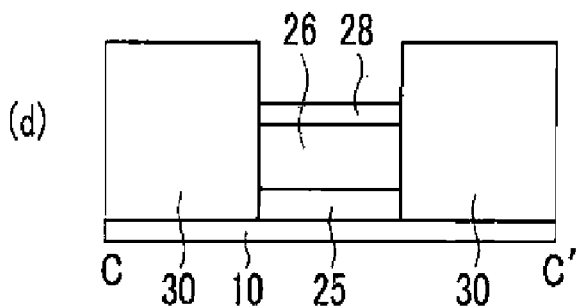
Figure 7:
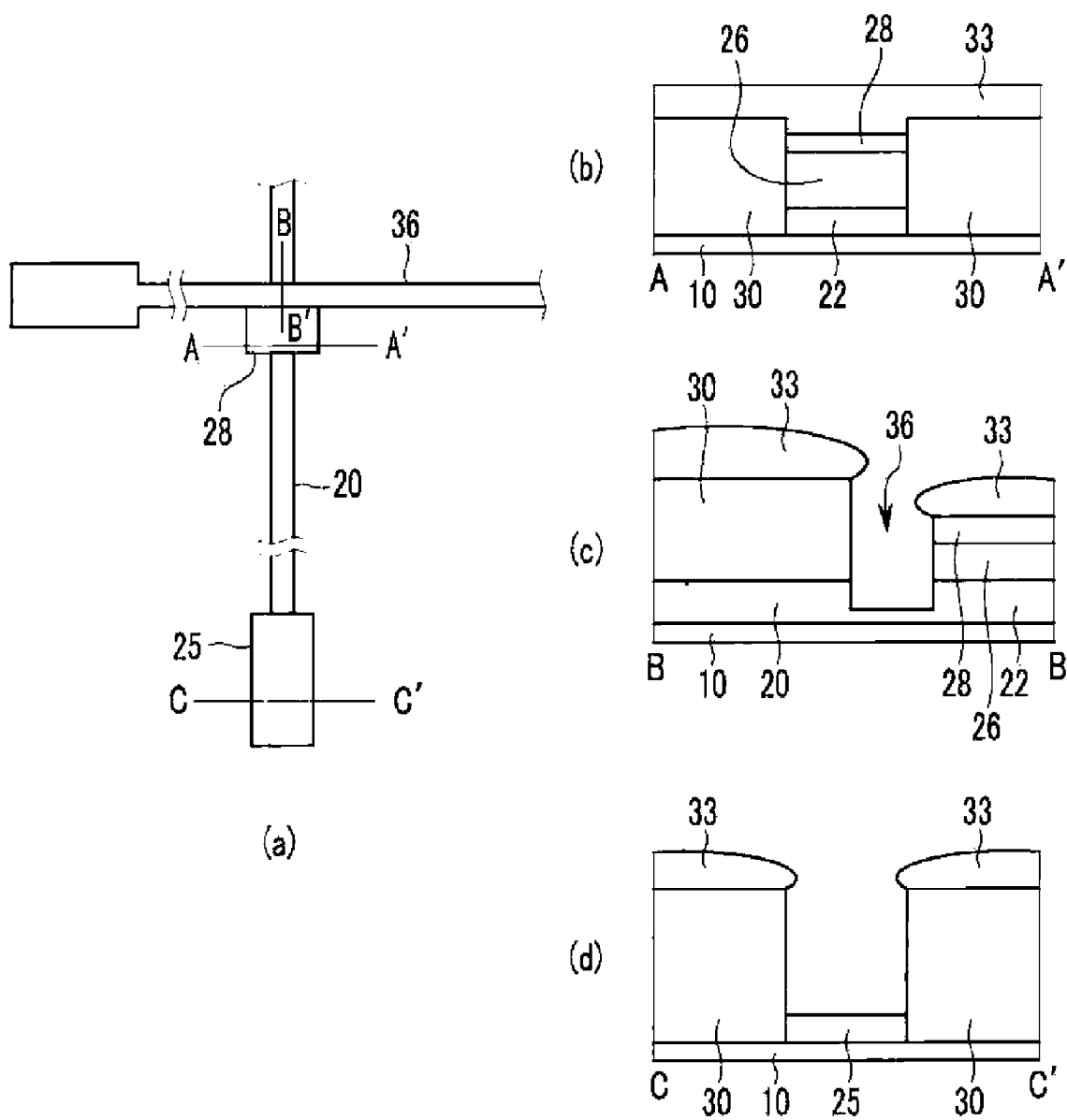

Referring to FIGS. 5 and 6, an oxide semiconductor layer (24, 26) and a drain metal layer (27,28) are formed by, for example, sputtering. As explained above, because the photosensitive layer of the boundary region of the first trench(34) is extruded into the first trench(34), the oxide semiconductor layer and the drain metal layer are formed discontinuously at the extruded portion of the photosensitive layer instead of being formed continuously on the substrate. By the result, as described in FIG. 5, the oxide semiconductor layer and the drain metal layer are separated into two portions, a portion formed on the photosensitive layer(32) and another portion formed inside the first trench(34). And then, the photosensitive layer(32) is removed as described in FIG. 6. The oxide semiconductor layer(24) and the drain metal layer(27) formed on the photosensitive layer(32) are removed together with the photosensitive layer(32) when the photosensitive layer(32) is removed. On the other hand, the oxide semiconductor layer(26) and the drain metal layer(28) formed inside the first trench(34) remain and forms an oxide semiconductor pattern(26) and a drain electrode(28).

As explained above, a channel length of the thin film transistor according to the present invention is determined by the thickness of the oxide semiconductor layer. Therefore, the channel length can be accurately reduced and ON current can be increased. At the same time, the ON current can be increased due to high effective mobility of the oxide semiconductor Referring to FIG. 7, a second trench(36) extending in a second direction crossing the data signal line(20) is formed on the first insulating layer(30). The second trench(36) is formed adjacent to the lamination of the source electrode(22), the oxide semiconductor pattern(26) and the drain electrode (28). The second trench(36) is formed by exposing and developing a photosensitive layer(33) and dry etching the first insulating layer(30) as at the case of the first trench(34). An aperture ratio loss of the display substrate can he minimized by forming the second trench(36) in which a gate wiring that will be explained latter is formed, at the region adjacent to the lamination(22,26,28).

Meanwhile, a portion of the data signal line(20) formed at a region crossing the second trench(36) is also etched when the first insulating layer(30) is dry etched. By the above, a recess that has certain depth is formed at a region of the data signal line(20) adjacent to the lamination(22,26,28), as illustrated in FIG. 7(c), and a gate electrode which is a portion of the gate wiring is formed on the recess. By forming the recess on the data signal line(20), it becomes possible to guarantee the position of the gate electrode which makes controlling channel current possible when gate voltage is applied.

And, as described in FIG. 7(d), the oxide semiconductor layer and drain metal layer that remained on the data pad electrode are also removed when the second trench (36) is formed, and therefore, the data pad electrode(25) is exposed.

Figure 8:
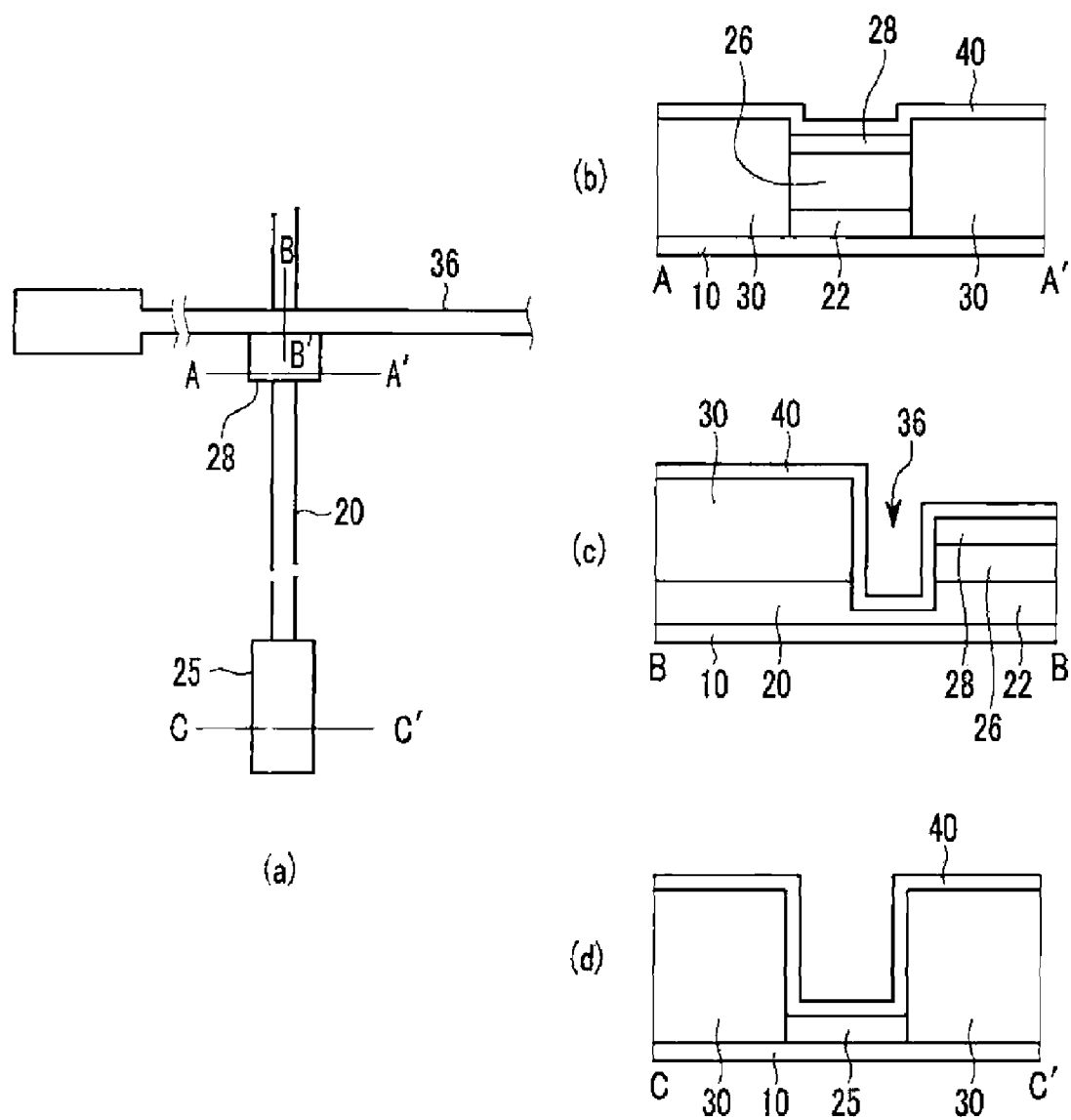

Referring to FIG. 8, a second insulating layer(40) is formed on the substrate. The second insulating layer(40) is made of, for example, SiNx.

Figure 9:
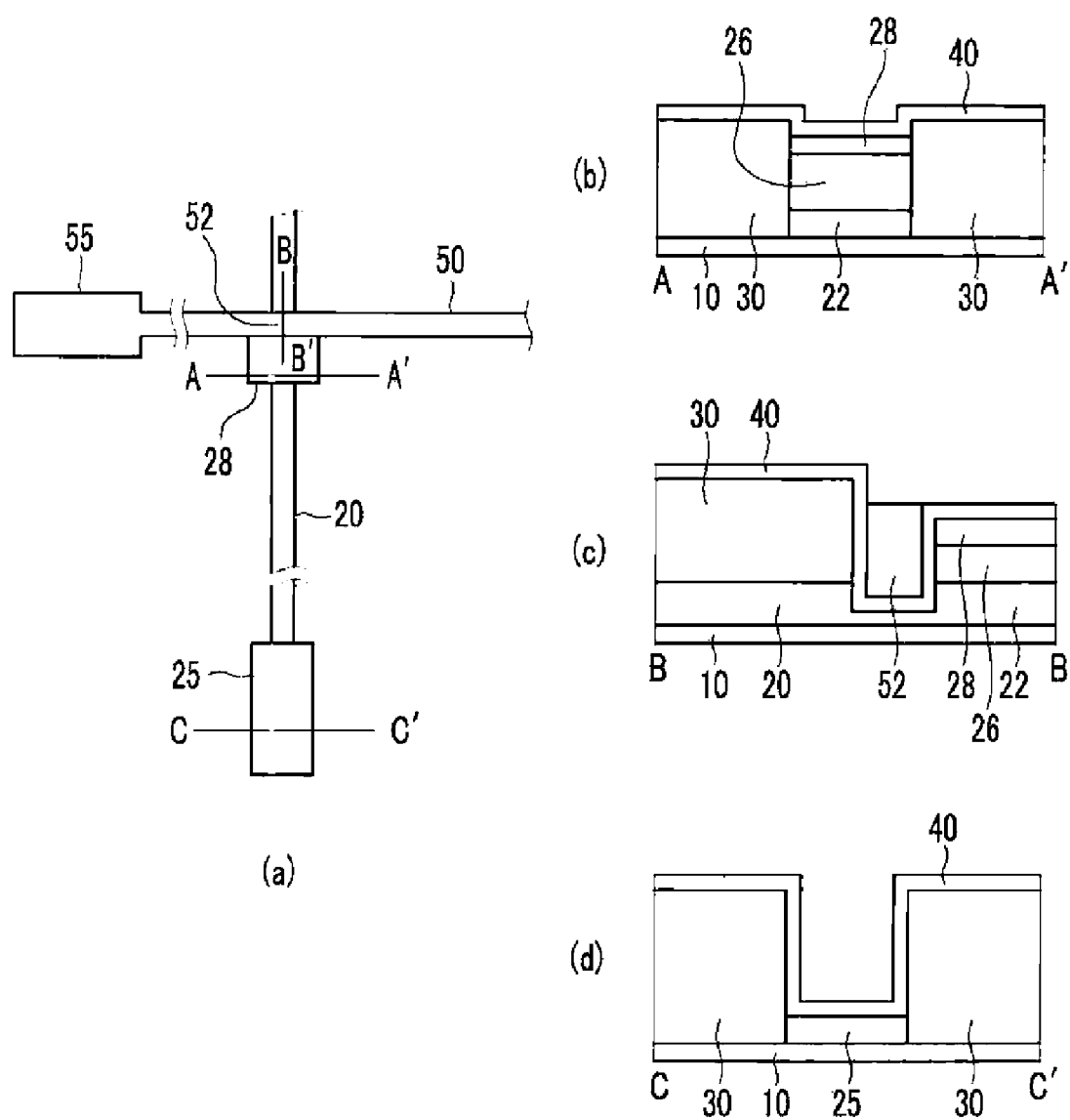

Referring to FIG. 9, a gate wiring including a gate signal line(50), a gate electrode(52) and a gate pad electrode(55) is formed on the second insulating layer(40) inside of the second trench(36).

The gate wiring (50,52,55) may be formed by sputtering and patterning a metal layer of, for example. Cu, Mo or Al. Or. The gate wiring may also be formed by sputtering Mo or Al is a seed layer, and forming an upper metal layer by electroless plating thereafter. Cu may be used for the upper metal layer.

Figure 10:
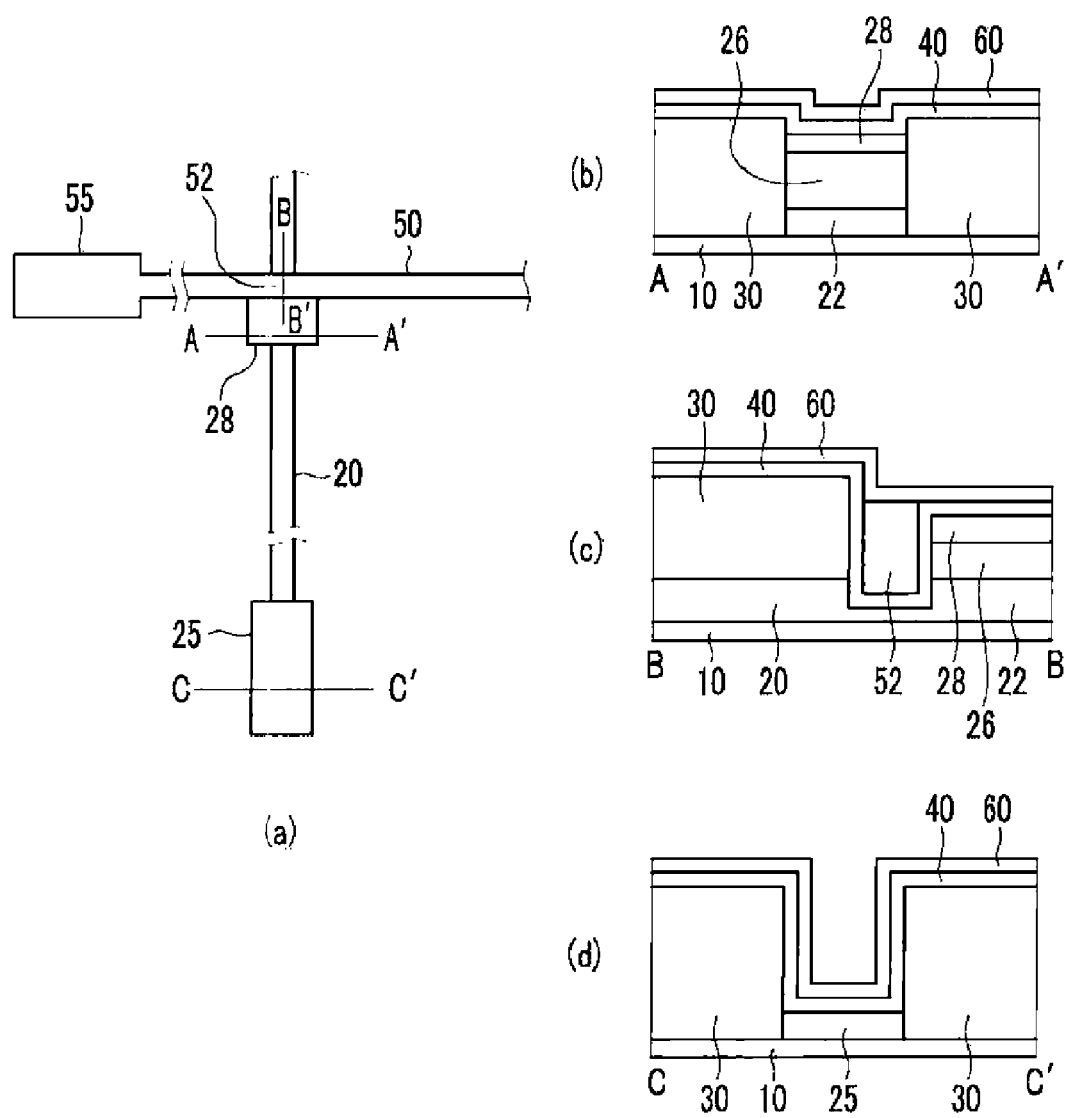
Figure 11:
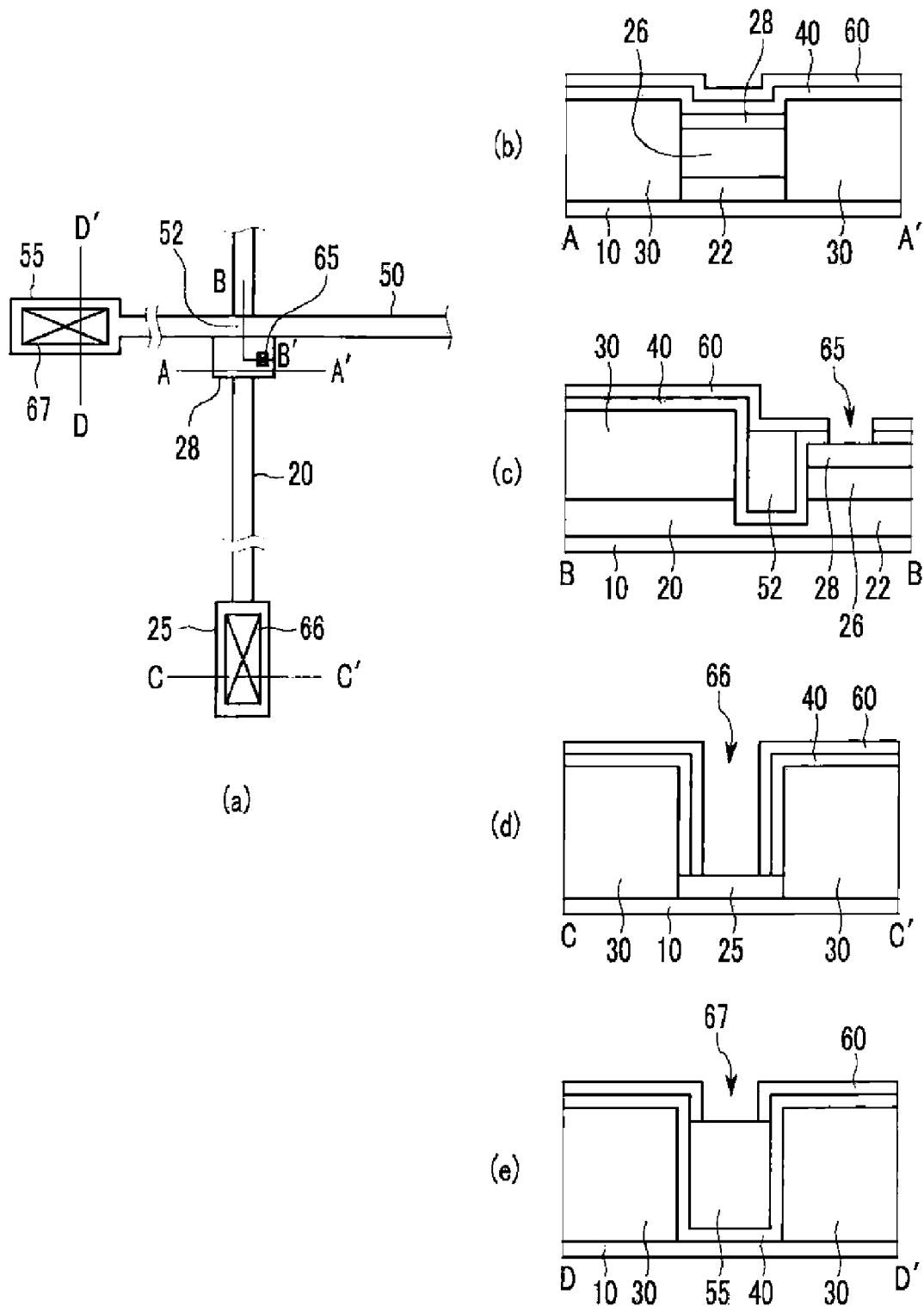

Referring to FIGS. 10 and 11, a third insulating layer(60) is formed on the substrate, and then first to third contact holes (65,66,67) are formed by a dry etching process. The third insulating layer(60) may be formed by depositing, for example, SiNx. The first and second contact holes(65,66) are formed by dry etching the third insulating layer(60) and the second insulating layer(40) together, and expose the drain electrode(28) and the data pad electrode(25), respectively. Meanwhile, the third contact hole(67) exposes the gate pad electrode(55).

Figure 12:
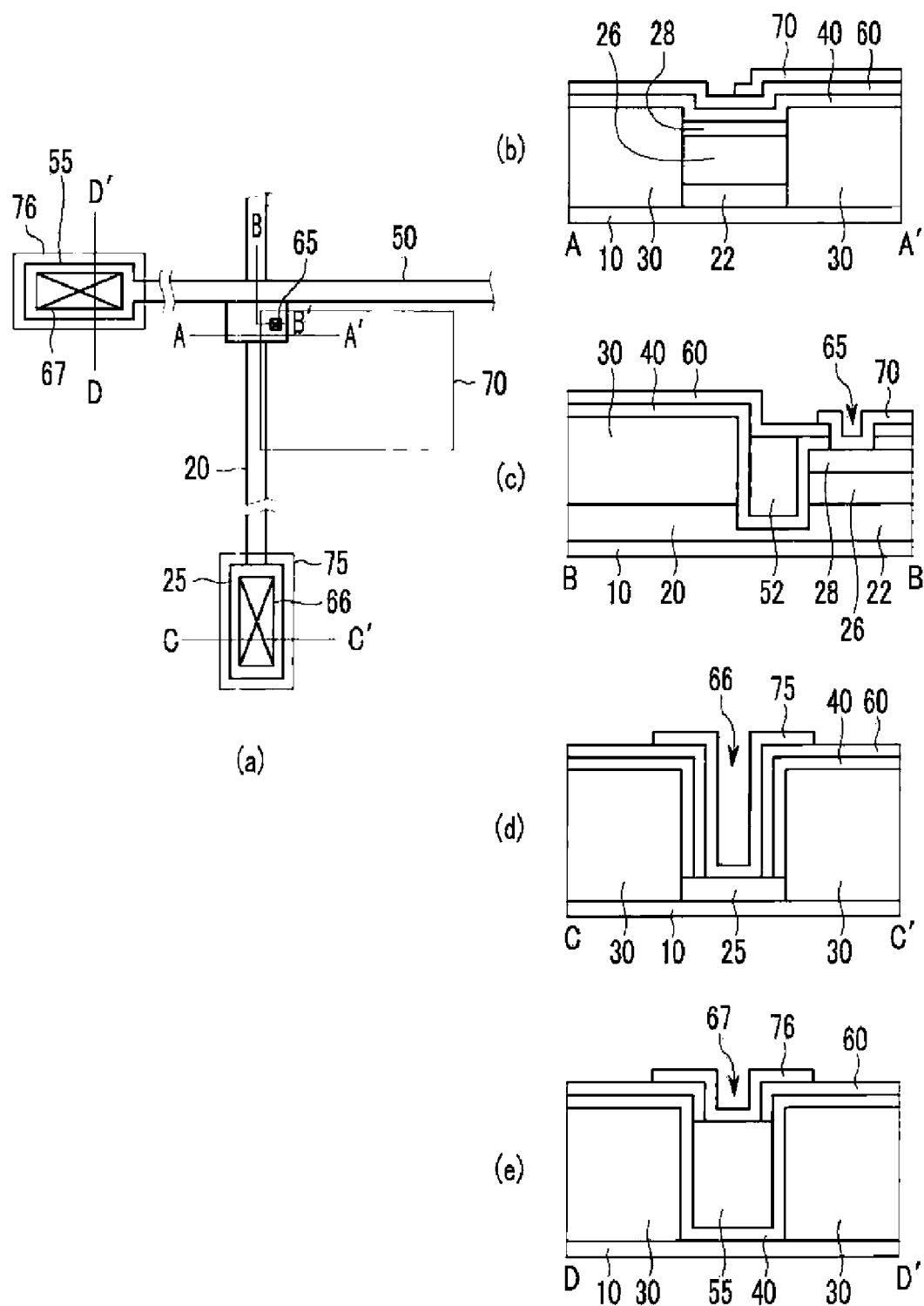

Finally referring to FIG. 12, a pixel electrode(70) and first and second auxiliary layers(75,76) are formed respectively, by forming and patterning transparent conductive layer on the third insulating layer(60). The pixel electrode(70) is connected to the drain electrode(28) through the first contact hole(65). Also, the first auxiliary layer(75) is connected to the data pad electrode(25) through the second contact hole(66), and the second auxiliary layer(76) is connected to the gate pad electrode(55) through the third contact hole(67).

As described above, the display substrates and the methods of manufacturing the display substrates according to the embodiments have many advantages.

In some embodiments of the invention the channel length of the thin film transistor can be accurately reduced, and therefore, ON current of thin film transistor can be increased without loss of aperture ratio.

And at the same time, the ON current can be increased by increasing effective mobility.

Although exemplary embodiments of the present invention have been described, it is understood that the present invention should not be limited to these exemplary embodiments but various changes and modifications can be made by one of ordinary skilled in the art within the spirit and scope of the present invention.

What is claimed is:

1. A display substrate comprising a gate line formed on a substrate, a data line, a thin film transistor connected to the gate line and the data line respectively and pixel electrode connected to the thin film transistor, wherein a channel of the thin film transistor is formed in a direction perpendicular to the substrate and, a layer where the channel is formed includes an oxide semiconductor pattern, wherein, a recess portion is formed on the data line and a gate electrode of the thin film transistor is formed on the recess portion.

2. A display substrate comprising:

a substrate;

a source electrode, an oxide semiconductor pattern and a drain electrode sequentially formed in a direction perpendicular to the substrate;

a gate electrode formed adjacent to the source electrode, the oxide semi conductor pattern and the drain electrode with an insulating layer being therebetween; and a pixel electrode connected to the drain electrode, wherein a recess portion is formed on a data signal line and the gate electrode is formed on the recess portion with the insulating layer being therebetween.

3. A display substrate comprising:

a substrate;

a data signal line extended in a first direction on the substrate;

a gate signal line extended in a second direction crossing the first direction and insulated from the data signal line;

a thin film transistor connected to the data signal line and the gate signal line; and a pixel electrode connected to the thin film transistor, wherein the thin film transistor comprises:

a source electrode connected to the data signal line;

an oxide semiconductor pattern formed on the source electrode;

a drain electrode formed on the oxide semiconductor pattern; and a gate electrode connected to the gate signal line and formed adjacent to the source electrode, the oxide semiconductor pattern and the drain electrode with an insulating layer being therebetween, wherein a recess portion is formed on the data signal line and the gate electrode is formed on the recess portion.

4. The display substrate as described in claim 3, wherein the oxide semiconductor pattern comprises at least one of Ga, Zn, In and Sn, and O.

5. The display substrate as described in claim 4, wherein the insulating layer is formed between the data signal line and the gate electrode.

* * * * *